United States Patent [19]
Hu

[11] Patent Number: 6,096,640
[45] Date of Patent: Aug. 1, 2000

[54] METHOD OF MAKING A GATE ELECTRODE STACK WITH A DIFFUSION BARRIER

[75] Inventor: Yongjun Hu, Boise, Id.

[73] Assignee: Micron Technology, Inc., Boise, Id.

[21] Appl. No.: 09/054,328

[22] Filed: Apr. 2, 1998

Related U.S. Application Data

[62] Division of application No. 08/931,336, Sep. 16, 1997, Pat. No. 5,962,904.

[51] Int. Cl.<sup>7</sup> .................................................. H01L 21/44
[52] U.S. Cl. .......................... 438/652; 438/653; 438/657
[58] Field of Search .................................. 438/653, 632, 438/648, 636, 652; 257/280, 412, 751, 764

[56] References Cited

U.S. PATENT DOCUMENTS

| | | | |
|---|---|---|---|
| 4,660,276 | 4/1987 | Hsu ............................................ | 438/303 |
| 4,847,111 | 7/1989 | Chow et al. .............................. | 438/586 |
| 5,066,615 | 11/1991 | Brady et al. ............................ | 438/636 |
| 5,106,786 | 4/1992 | Brady et al. ............................ | 438/655 |
| 5,132,756 | 7/1992 | Matsuda .................................. | 257/653 |
| 5,237,192 | 8/1993 | Shimura .................................. | 257/280 |
| 5,341,016 | 8/1994 | Prall et al. .............................. | 257/412 |
| 5,593,924 | 1/1997 | Apte et al. .............................. | 438/648 |
| 5,670,823 | 9/1997 | Kruger .................................... | 257/751 |
| 5,719,410 | 2/1998 | Suchiro et al. ......................... | 257/750 |
| 5,736,455 | 4/1998 | Iyer et al. ................................ | 138/592 |
| 5,739,046 | 4/1998 | Lur et al. ................................. | 438/653 |
| 5,763,322 | 6/1998 | Hagen et al. . | |
| 5,776,823 | 7/1998 | Agnello et al. .......................... | 438/653 |
| 5,847,463 | 12/1998 | Trivedi et al. ........................... | 257/751 |

OTHER PUBLICATIONS

J.S. Reid et al., Evaluation of amorphous (Mo, Ta, W)–Si–N diffusion barriers for <Si > |Cu metallizations, Thin Solid Films, pp 319–324, Dec. 1993.

*Primary Examiner*—Wael Fahmy
*Assistant Examiner*—William David Coleman
*Attorney, Agent, or Firm*—Workman, Nydegger & Seeley

[57] ABSTRACT

Disclosed is a gate electrode stack structure that uses a refractory metal silicon nitride layer as a diffusion barrier. The gate electrode stack has several layers, including a gate oxide layer over the semiconductor substrate, a polysilicon layer over the gate oxide layer, and the diffusion barrier between the polysilicon layer and a layer of electrically conductive material above. The diffusion barrier, which is preferably composed of a substantially amorphous refractory metal silicon nitride such as tungsten silicon nitride, does not oxidize when an oxidation process is applied to the gate electrode stack. Moreover, the diffusion barrier substantially prevents diffusion of the electrically conductive material into the polysilicon during heating processes. The refractory metal silicon nitride maintains a bulk resistivity less than 2,000 microhm-cm, thereby preserving satisfactory conductivity in the gate electrode stack. A process for forming the gate electrode stack and diffusion barrier is also disclosed.

26 Claims, 4 Drawing Sheets

METHOD OF MAKING A GATE ELECTRODE STACK WITH A DIFFUSION BARRIER

This is a divisional application of U.S. patent application Ser. No. 08/931,336, filed on Sep. 16, 1997, now U.S. Pat. No. 5,962,904.

BACKGROUND OF THE INVENTION

1. The Field of the Invention

The present invention involves a device formed on a semiconductor substrate. More particularly, the present invention relates to a gate electrode stack with a refractory metal silicon nitride diffusion barrier.

2. The Relevant Technology

Modern integrated circuits are manufactured by an elaborate process in which a large number of electronic semiconductor devices are integrally formed on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described herein.

The semiconductor industry has been characterized with a continuous effort directed toward reducing device size and increasing the density of devices on semiconductor substrates. Such devices include transistors, capacitors, diodes, and the like. Regarding transistors, it has proved advantageous to use a refractory metal in the formation of gate electrode stacks and interconnections. Gate electrode stacks are conventionally designed with a thin layer of gate oxide positioned on a semiconductor substrate. A conducting layer of polysilicon is formed over the gate oxide. A second conducting layer consisting of a refractory metal, often tungsten, is formed over the polysilicon layer.

It has been found that a diffusion barrier positioned between the refractory metal layer and the polysilicon layer is useful for preserving the conductive qualities of the refractory metal. Processes used for producing semiconductor devices typically involve subjecting a device to several thermal processes with temperatures higher than the temperature at which refractory metals react with silicon to form suicides. For example, tungsten reacts with silicon at about 550° C. to 600° C. In the absence of a diffusion barrier, refractory metal material from the refractory metal layer diffuses into the polysilicon layer during thermal processes and forms a refractory metal silicide. The resulting refractory metal silicide increases the sheet resistivity of the semiconductor device, and causes the speed of the semiconductor device to be reduced. A diffusion barrier preserves the conductivity of the semiconductor device by preventing refractory metal from diffusing into the polysilicon layer during thermal processes.

Conventionally, diffusion barriers have consisted of either a refractory metal nitride or a refractory metal silicide. There are disadvantages to both of these materials. When a semiconductor device containing a refractory metal nitride diffusion barrier is exposed to a heat process, such as a source/drain reoxidation process, some of the refractory metal nitride is oxidized. Refractory metal nitride oxide has a greater bulk resistivity than refractory metal nitride. Therefore, the oxidized diffusion barrier impairs the conductivity and the efficiency of the semiconductor device. If sufficiently oxidized, the diffusion barrier can substantially electrically insulate the refractory metal layer. This can cause what is termed "a floating gate." Diffusion barriers made of refractory metal nitride have proven unsuitable in many applications involving thermal oxidation processes.

Likewise, problems are associated with diffusion barriers containing refractory metal silicide. Thermal processes can cause refractory metal silicide in diffusion barriers to form grains with grain boundaries. Refractory metal from the refractory metal layer can then diffuse through the diffusion barrier, facilitated by the grain boundaries, into the polysilicon layer. Some of the refractory metal layer can then react with polysilicon, thereby forming more refractory metal silicide, which has a bulk resistivity higher than that of bare refractory metal. Therefore, heating processes such as annealing can increase the sheet resistivity of semiconductor devices having refractory metal silicide diffusion barriers and can impair their function. Moreover, as device size is reduced, diffusion barriers containing refractory metal silicide impairs semiconductor device conductivity even in the absence of thermal processes.

As can be seen, it would be advantageous to provide a diffusion barrier that does not impair the conductivity of a semiconductor device as a result of a heating process. In particular, a diffusion barrier is needed that will not substantially oxidize during thermal oxidation processes. Additionally, a diffusion barrier is needed that will substantially prevent diffusion of refractory metal into polysilicon during heating processes.

SUMMARY OF THE INVENTION

The present relates to a gate electrode stack formed on a semiconductor substrate having a diffusion barrier positioned between a silicon-containing material and a electrically conductive material.

According to one embodiment of the invention, a gate electrode stack with a diffusion barrier containing an electrically conductive silicon nitride is provided, along with a method for forming the gate electrode stack and diffusion barrier. The diffusion barrier maintains a resistivity sufficiently low to allow satisfactory function of the gate electrode stack.

The gate electrode stack of the present invention comprises a dielectric layer, preferably a gate oxide layer, formed on a semiconductor substrate. There is a layer of silicon-containing material, preferably polysilicon, that is formed over the gate oxide layer. A diffusion barrier comprising an electrically conductive silicon nitride material (ESN) lies over and in contact with the layer of silicon-containing material. Preferably, the ESN is a substantially amorphous refractory metal silicon nitride, such as tungsten silicon nitride or titanium silicon nitride, and is most preferably tungsten silicon nitride. The refractory metal silicon nitride can be comprised of both tungsten silicon nitride and titanium silicon nitride. An electrically conductive material, such as a refractory metal is positioned over and in contact with the diffusion barrier.

According to the invention, the ESN has a bulk resistivity less than 2,000 microhm-cm, permitting the gate electrode stack to have sufficient conductivity. The ESN is such that it maintains a bulk resistivity less than 2,000 microhm-cm after the gate electrode stack is exposed to any of a number of heating processes, including, but not limited to thermal oxidation processes and annealing processes. Moreover, the ESN maintains its substantially amorphous structure without forming grains during heating processes. The amorphous structure of the ESN inhibits diffusion of the electrically conductive material through the diffusion barrier into the layer of silicon-containing material during heating processes. The diffusion barrier thus substantially prevents the formation of suicides of the electrically conductive material that would otherwise reduce the conductivity of the gate electrode stack. Accordingly, a gate electrode stack of the present invention has a sheet resistivity less than 1.7 ohm/cm$^2$ both before and after being exposed to a heating process.

BRIEF DESCRIPTION OF THE DRAWINGS

In order that the manner in which the above-recited and other advantages of the invention are obtained, a more particular description of the invention briefly describe above will be rendered by reference to specific embodiments thereof which illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

Figure 1:
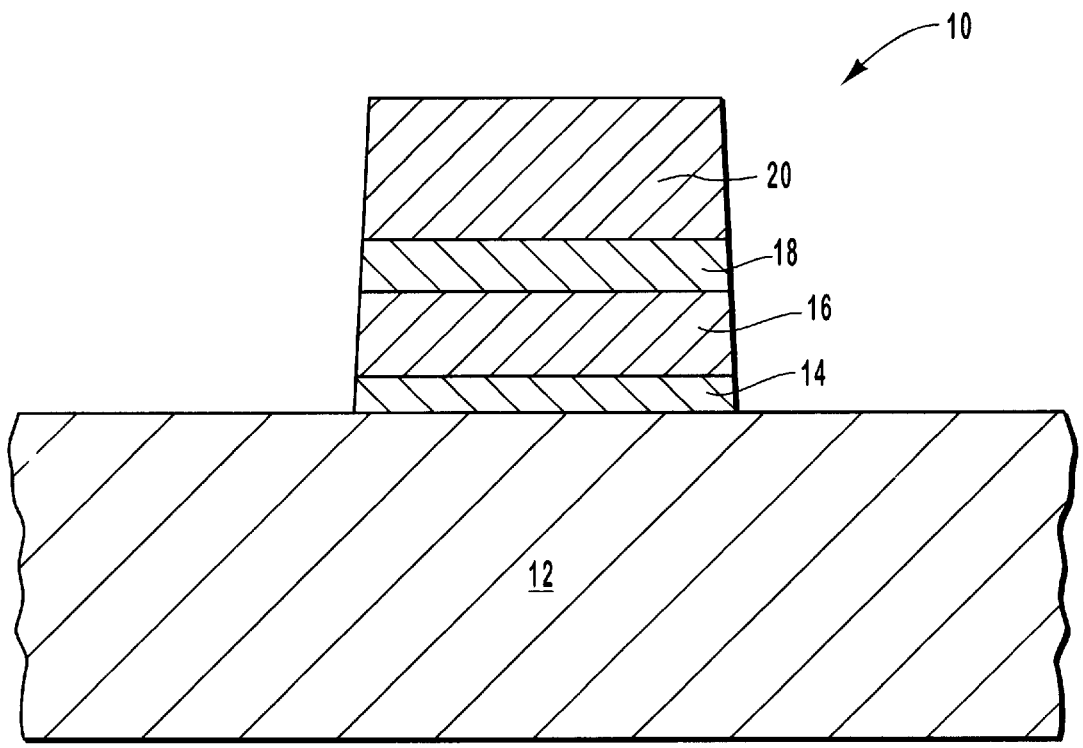
FIG. 1 is a cross-section elevation view of a gate electrode stack with a diffusion barrier positioned over a semiconductor substrate.

In the following detailed description and in the several figures of the drawings, like elements are identified with like reference numerals.

Referring now to FIG. 1, a structure 10 is formed over semiconductor substrate 12. In this embodiment, structure 10 is a gate electrode stack. Preferably, semiconductor substrate 12 comprises monocrystalline silicon. A gate oxide layer 14, preferably having a thickness in a range from about 20 angstroms to about 200 angstroms, and most preferably about 90 angstroms, is disposed on semiconductor substrate 12. A layer of silicon-containing material 16 is positioned above the gate oxide layer. In the preferred embodiment, layer of silicon-containing material 16 is composed of polysilicon and has a thickness in a range from about 500 angstroms to about 5000 angstroms.

A diffusion barrier 18, preferably having a thickness in a range from about 50 angstroms to about 500 angstroms, and most preferably about 150 angstroms, is formed over and in contact with layer of silicon-containing material 16. Diffusion barrier 18 comprises any electrically conductive silicon material that has a bulk resistivity less than 2,000 microhm-cm and as low as 50 microhm-cm, both before and after being exposed to a heating process as will be described in detail below. Preferably, the electrically conductive material is a refractory metal silicon nitride (RmSi$_x$N$_y$). A refractory metal for purposes of the invention described herein includes but is not limited to titanium, chromium, tantalum, platinum, tungsten and zirconium, and also includes molybdenum. RmSi$_x$N$_y$ can be comprised of both tungsten silicon nitride and titanium silicon nitride. For example, a preferred embodiment uses a diffusion barrier substantially composed of tungsten silicon nitride (WSi$_x$N$_y$). An electrically conductive layer 20 is disposed over and in contact with diffusion barrier 18. Electrically conductive layer 20 comprises electrically conductive material that reacts with silicon to form silicide. Preferably, electrically conductive layer 20 has a thickness in a range from about 500 Å to about 5000 Å, a most preferable thickness of about 1000 angstroms, and comprises a refractory metal, which most preferably is tungsten.

Figure 2:
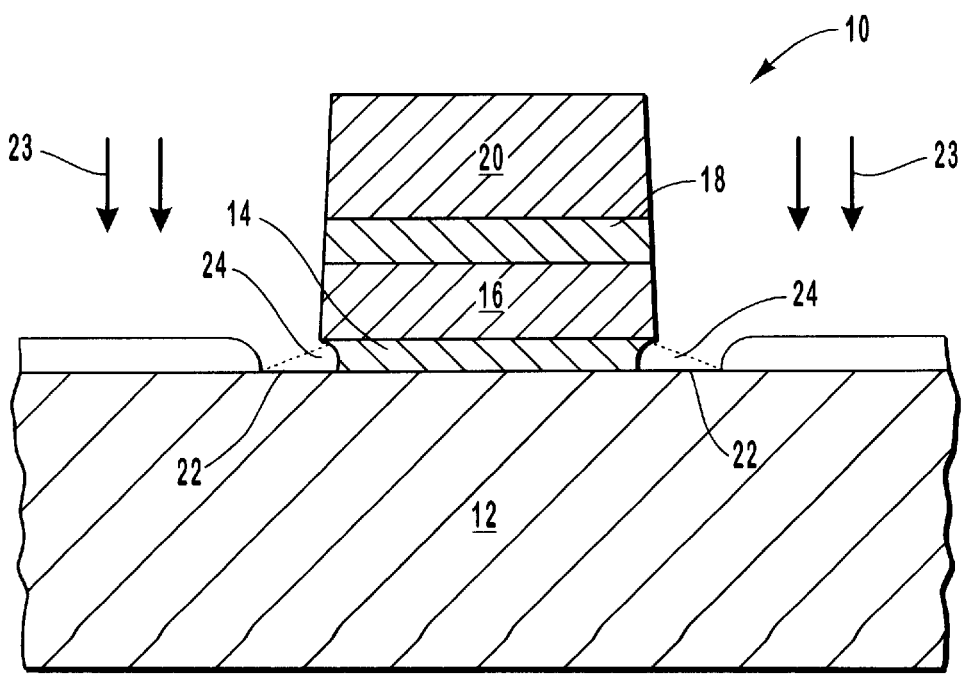
FIG. 2 is a cross-section elevation view of the gate electrode stack and diffusion barrier showing damage to a gate oxide layer for which an oxidation process is performed to repair the damaged gate oxide layer.

FIG. 2 illustrates structure 10 exposed to a heating process. In this application, an exposed surface 22 of semiconductor substrate 12 adjacent to gate oxide layer 14 has been formed using any known process. For instance, a dry etch process can be used to create exposed surface 22. In FIG. 2, a portion of gate oxide layer 14 has been physically removed and damaged by the process of forming exposed surface 22. Accordingly, an thermal oxidation process, commonly known as a source/drain reoxidation process, is conducted on structure 10 and semiconductor substrate 12. By way of example, an oxidizing atmosphere 23 comprising oxygen having a temperature in a range from about 700° C. to about 1100° C., and preferably about 1000° C., is applied for a period in a range from about 5 minutes to about 50 minutes, and preferably about 30 minutes. Oxidizing atmosphere 23 oxidizes exposed surface 22 to form silicon dioxide (SiO$_2$), thereby forming extensions 24 (shown in phantom) in contact with gate oxide layer 14.

The thermal oxidation process exposes diffusion barrier 18 to heat. The electrically conductive silicon nitride material of diffusion barrier 18 is self-passivating according to the invention, meaning that it does not significantly oxidize during the oxidation process. The lack of oxidation allows the electrically conductive silicon nitride material to retain a bulk resistivity less than 2,000 microhm-cm after heating. Thus, the conductivity and related efficiency of structure 10 is not impaired by the oxidation process.

Figure 2A:
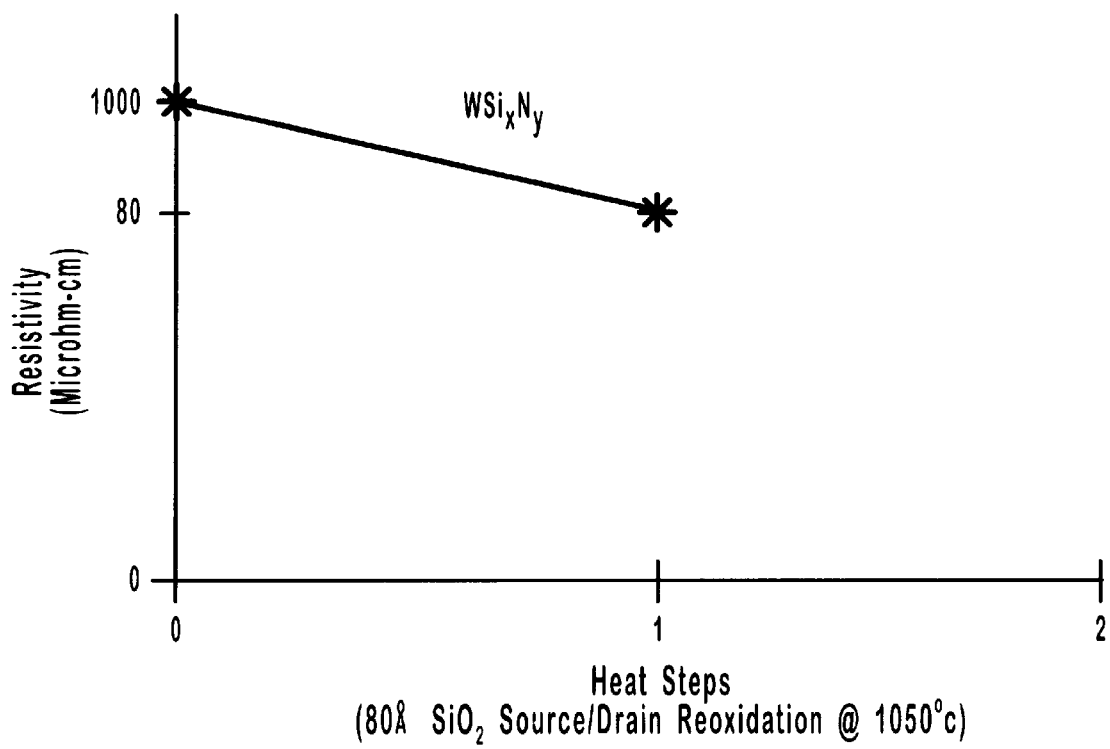
FIG. 2a is a graph of the resistivity of tungsten silicon nitride before and after an oxidation process.

According to another preferred embodiment of the invention as shown in FIG. 2, a thermal oxidation process is conducted in an oxygen atmosphere having a temperature of 1050° C. until extensions 24 having a thickness of about 80 angstroms are formed. Diffusion barrier 18 is substantially composed of tungsten silicon nitride (WSi$_x$N$_y$). In this embodiment, tungsten silicon nitride has a second bulk resistivity after heating less than a first bulk resistivity before the oxidation process as graphed in FIG. 2a. This is believed to be caused by the tungsten silicon nitride becoming more dense during heating.

Figure 3:
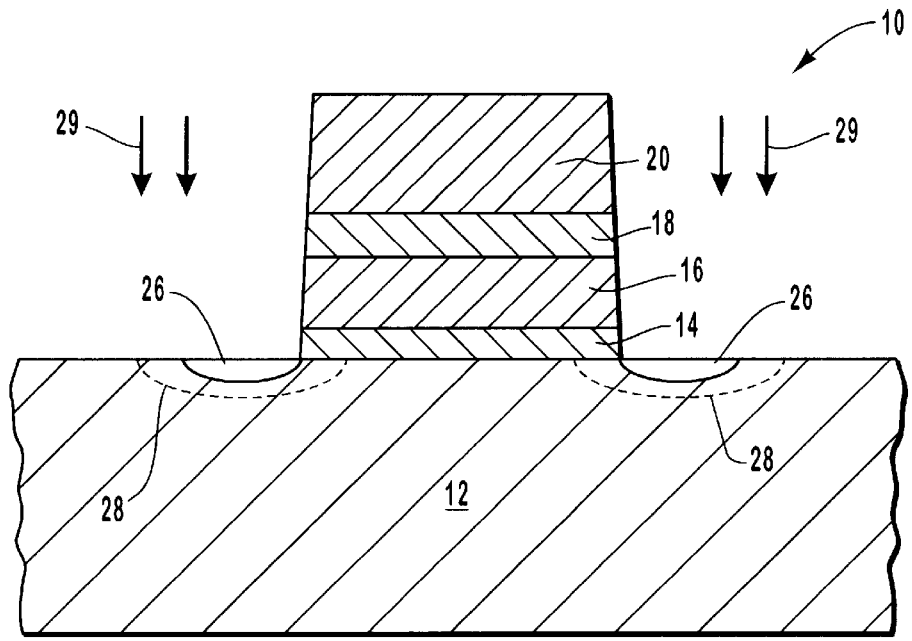
FIG. 3 is a cross-section elevation view of the gate electrode stack and diffusion barrier showing doped regions of the semiconductor substrate that are to be annealed.

FIG. 3 illustrates structure 10 exposed to another heating process. In this application, doped regions 26 of semiconductor substrate 12 have been formed using any suitable process by which silicon is doped. Next, a heating process is conducted on both of structure 10 and semiconductor substrate 12 to cause a portion of the dopant material in doped regions 26 to diffuse into previously undoped regions 28 (shown in phantom). Specifically, an anneal process is conducted by applying an annealing atmosphere 29 having a temperature in a range from about 650° C. to about 1150° C., and most preferably at about 1000° C., for a period in a range from about 10 seconds to about 90 seconds, and most preferably for about 20 seconds. In some applications of the present invention, more than one of such anneal processes may be needed.

The anneal process exposes diffusion barrier 18 to heat. The electrically conductive silicon nitride material of diffusion barrier 18 does not form grains during oxidation, but maintains a substantially amorphous form. Maintaining an amorphous form allows diffusion barrier 18 to continue to substantially prevent diffusion of electrically conductive material of electrically conductive layer 20 through diffusion barrier 18 into layer of silicon-containing material 16. This, in turn, substantially prevents formation of silicide of the electrically conductive material. Preferably, the gate electrode stack maintains a sheet resistivity less than 1.7 ohm/sq., and can be as low as 1.0 ohm/sq.

Figure 4:
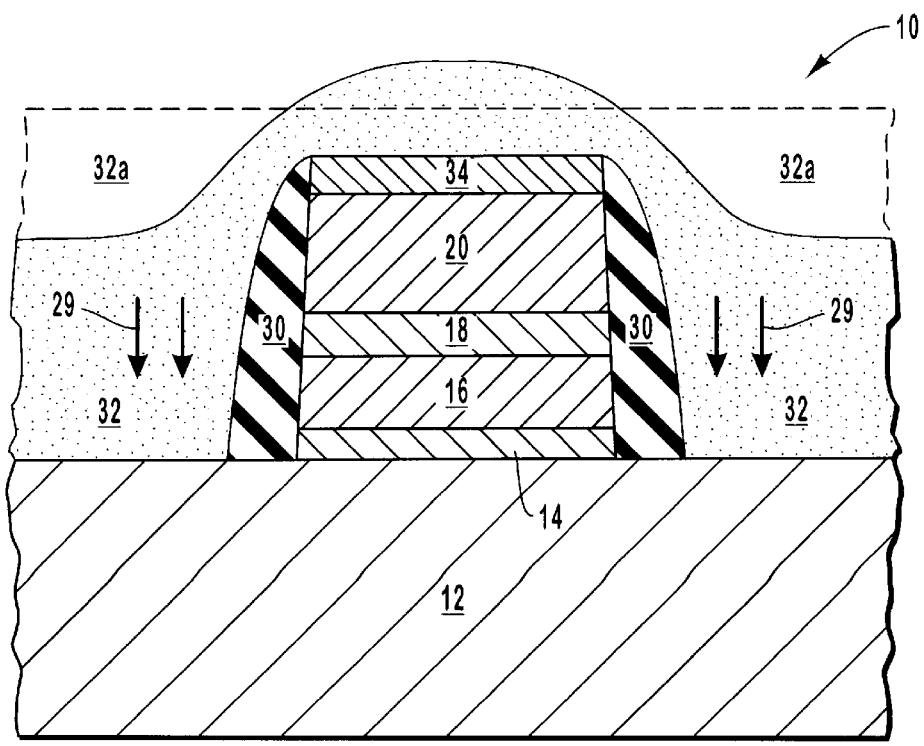
FIG. 4 is a cross-section elevation view of the gate electrode stack and diffusion barrier showing a borophosphosilicate glass material (BPSG) that is fluidly displaced in an annealing process.

FIG. 4 shows structure 10 exposed to another heating process. In this embodiment, a silicate glass 32, preferably BPSG, is disposed on structure 10. An anneal process as described above in reference to FIG. 3 is conducted on structure 10 to cause a portion of silicate glass 32 to be fluidly displaced as shown at 32a (shown in phantom). Diffusion barrier 18 has the same advantages in relation to the anneal process of FIG. 4 as those discussed above in reference to FIG. 3. A cap 34 is upon electrically conductive layer 20 and a spacer 30 is shown as being in contact with electrically conductive layer 20, diffusion barrier 18, layer of silicon-containing material 16, and gate oxide layer 14. Cap 34 and spacer 30 are preferably substantially composed of silicon nitride or silicon dioxide.

Figure 5:
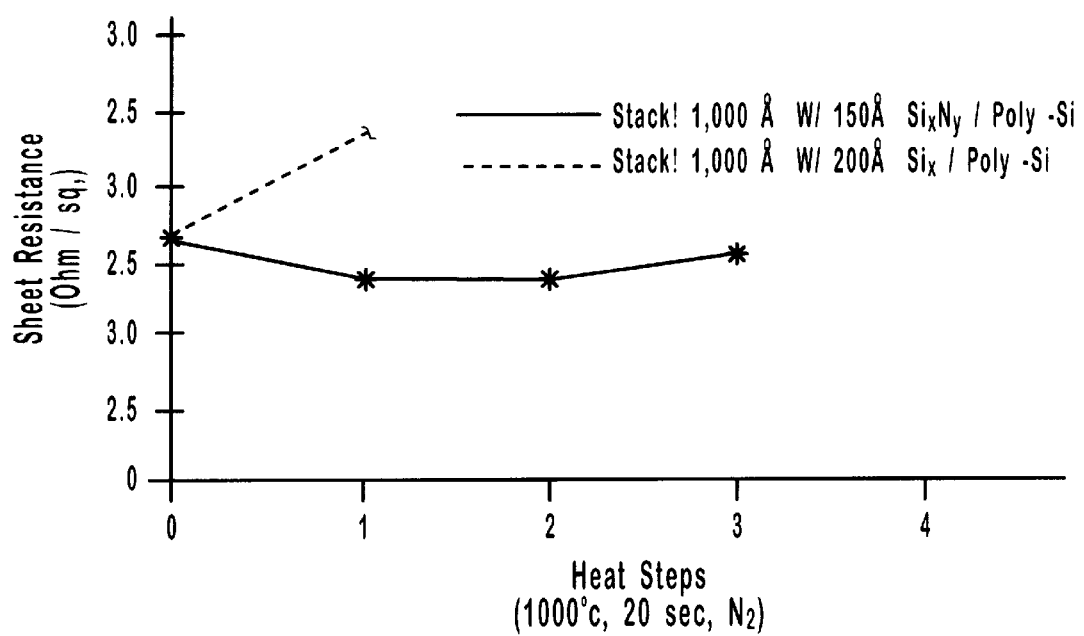
FIG. 5 is a graph of the sheet resistivity of a gate electrode stack having a tungsten silicon nitride diffusion barrier versus successive heating steps in accordance with one embodiment of the invention. For comparison purposes, the graph also shows sheet resistivity of a gate electrode stack having a tungsten silicide diffusion barrier.

FIG. 5 shows the effects of the above described heat processes on a tungsten silicon nitride material of diffusion barrier 18 as compared to a tungsten gate stack commonly used in diffusion barriers in the prior art. As is evident, the resistivity of the new tungsten/tungsten silicon nitride gate stack remains below 1.7 ohm/sq. during each of three heat steps. Each heat step involves exposing a gate electrode stack 10 of FIG. 1 to an annealing atmosphere of nitrogen gas at 1000° C. for 20 seconds. In contrast, the resistivity of a tungsten/tungsten silicide gate stack reaches about 2.4 ohm/sq. after only one such anneal process.

It will also be noted that a refractory metal silicon nitride is susceptible to selective removal by a dry etch process. For example, a dry etch using $CHF_4$ can be used to form structure 10 of FIG. 1 when diffusion barrier 18 consists of tungsten silicon nitride ($WSi_xN_y$). Tungsten reacts with fluorine from the etchant to form $WF_6$, silicon reacts with hydrogen to form silane ($SiH_4$), and nitrogen combines with hydrogen to form ammonia ($NH_3$), each of which is volatile and can be removed by a vacuum hood during the dry etch.

Gate oxide layer 14 disposed on semiconductor substrate 12 can be thermally grown. Layer of silicon-containing material 16 can be deposited by chemical vapor deposition through decomposition of a precursor. Diffusion barrier 18 can be formed by a physical vapor deposition process that reactively sputters a substantially amorphous refractory metal silicide target in a nitrogen containing atmosphere so as to deposit a layer of a substantially amorphous refractory metal silicide nitride material. By way of example, a tungsten silicide target in an amphorous phase, as opposed to a multiple crystalline phase, can be reacted in an $N_2$ ambient during sputtering to deposit a tungsten silicide nitride diffusion barrier. Electrically conductive layer 20 can be deposited by chemical or physical vapor deposition. Silicate glass 32 can be conventionally deposited, such as by chemical vapor deposition.

A diffusion barrier such as diffusion barrier 18 of FIG. 1 consisting of tungsten silicon nitride has a sufficiently smooth surface to be satisfactorily processed using a dry etch process. For example, a surface roughness analysis has been made on a gate stack of 1000 Å tungsten on 150 Å tungsten silicon nitride. The gate stack had a maximum peak-to-peak thickness of about 11.2 nm, or about 11.2% of the stack thickness. This value is well under 25%, beyond which point diffusion barriers do not consistently and reliably function after being processed by a dry etch system.

The present invention has application to a wide variety of heating processes. An electrically conductive silicon nitride diffusion barrier according to this invention maintains resistivity less than 2,000 microhm-cm and is effective for maintaining satisfactorily low sheet resistivity within gate electrode stacks in connection with various heating processes beyond those specifically described herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for forming a structure on a semiconductor substrate, said process comprising:

forming a layer of silicon-containing material over said semiconductor substrate;

forming a first electrically conductive layer comprising both tungsten silicon nitride and of titanium silicon nitride over said layer of silicon-containing material; and forming a second electrically conductive layer over said first electrically conductive layer.

2. A process as recited in claim 1, wherein said process further comprises heating said structure in an oxidizing atmosphere after forming said second electrically conductive layer, said first electrically conductive layer being substantially not oxidized by said heating.

3. A process as recited in claim 2, wherein said first electrically conductive layer has a bulk resistivity less than 2,000 microhm-cm after said heating.

4. A process as recited in claim 1, wherein said process further comprises heating said structure after forming said second electrically conductive layer, said first electrically conductive layer substantially preventing electrically conductive material of said second electrically conductive layer from diffusing through said first electrically conductive layer into said layer of silicon-containing material during said heating.

5. A process as recited in claim 4, wherein said structure has a sheet resistivity of less than 1.7 ohm/sq. after said heating.

6. A process as recited in claim 1, further comprising a dry etch for selectively removing a portion of said first electrically conductive layer.

7. A process for forming a structure on a semiconductor substrate, said process comprising:

forming an oxide layer over a semiconductor substrate;

forming a polysilicon layer over said oxide layer;

forming a diffusion barrier over and in contact with said polysilicon layer, said diffusion barrier including a refractory metal silicon nitride material composed of both tungsten silicon nitride and of titanium silicon nitride;

forming a refractory metal layer over and in contact with said diffusion barrier, said structure including said oxide layer, said polysilicon layer, said diffusion barrier, and said refractory metal layer;

exposing a portion of said semiconductor substrate adjacent to said oxide layer; and heating both of said structure and said portion of said semiconductor substrate in an oxidizing atmosphere.

8. A process as recited in claim 7, wherein said refractory metal silicon nitride material has a first bulk resistivity and a first density before said heating and has a second bulk resistivity and a second density after said heating, and wherein said first bulk resistivity is less than 2,000 microhm-cm and said second bulk resistivity is less than 2,000 microhm-cm.

9. A process as recited in claim 8, wherein said second bulk resistivity is less than said first bulk resistivity.

10. A process as recited in claim 7, wherein said refractory metal silicon nitride material has a first bulk resistivity and a first density before said heating and has a second bulk resistivity and a second density after said heating, and wherein said second density is greater than said first density and wherein said second bulk resistivity is less than 2,000 microhm-cm.

11. A process as recited in claim 7, wherein said heating comprises an oxidation process whereby both of said structure and said portion of said semiconductor substrate are exposed to an oxidizing atmosphere having a temperature in a range from about 700° C. to about 1100° C. for a period in a range from about 5 minutes to about 50 minutes.

12. A process as recited in claim 7, wherein heating both of said structure and said portion of said semiconductor substrate in said oxidizing atmosphere oxidizes said portion of said semiconductor substrate to form a layer of oxide on said portion of said semiconductor substrate that is in contact with said oxide layer over said semiconductor substrate.

13. A process as recited in claim 7, said oxide layer is substantially composed of silicon dioxide and said semiconductor substrate is substantially composed of monocrystalline silicon in contact with the oxide layer.

14. A process for forming a structure on a semiconductor substrate, said process comprising:

forming a gate oxide layer over a semiconductor substrate;

forming a polysilicon layer over said gate oxide layer;

forming a diffusion barrier over and in contact with said polysilicon layer, said diffusion barrier including both tungsten silicon nitride and titanium silicon nitride and having a first bulk resistivity less than 2,000 microhm-cm;

forming a tungsten layer over and in contact with said diffusion barrier, such that said structure includes said gate oxide layer, said polysilicon layer, said diffusion barrier, and said tungsten layer;

exposing a portion of said semiconductor substrate adjacent to said gate oxide layer; and conducting an oxidation process whereby both of said structure and said portion of said semiconductor substrate are exposed to an oxidizing atmosphere having a temperature in a range from about 700° C. to about 1100° C. for a period in a range from about 5 minutes to about 50 minutes, whereby said portion of said semiconductor substrate is oxidized, said tungsten silicon nitride having a second bulk resistivity after said oxidation process less than 2,000 microhm-cm.

15. A process for forming a structure on a semiconductor substrate, said process comprising:

forming a gate oxide layer over a semiconductor substrate;

forming a polysilicon layer over said gate oxide layer;

forming a diffusion barrier over and in contact with said polysilicon layer, said diffusion barrier including a refractory metal silicon nitride material composed of both tungsten silicon nitride and of titanium silicon nitride;

forming a refractory metal layer over and in contact with said diffusion barrier, such that said structure includes said gate oxide layer, said polysilicon layer, said diffusion barrier, and said refractory metal layer;

applying a dopant material to a portion of said semiconductor substrate, thereby forming a doped region of said semiconductor substrate and an adjacent undoped region of said semiconductor substrate; and heating both of said structure and said doped region of said semiconductor substrate, whereby a portion of said dopant material in said doped region diffuses into a portion of said undoped region, said structure having a first sheet resistance before said heating and a second sheet resistance after said heating.

16. A process as recited in claim 15, wherein said first sheet resistance is less than 1.7 ohm/sq. and said second sheet resistance is less than 1.7 ohm/sq.

17. A process as recited in claim 16, wherein said second sheet resistance is less than said first sheet resistance.

18. A process as recited in claim 15, wherein said heating comprises an anneal process whereby both of said structure and said doped region of said semiconductor substrate are exposed to an annealing atmosphere having a temperature in a range from about 650° C. to about 1150° C. for a period in a range from about 10 seconds to about 90 seconds.

19. A process as recited in claim 15, wherein said heating is a rapid thermal heating process.

20. A process as recited in claim 15, wherein said heating comprises at least two of said heating processes.

21. A process for forming a structure on a semiconductor substrate, said process comprising:

forming a gate oxide layer over said semiconductor substrate;

forming a polysilicon layer over said gate oxide layer;

forming a diffusion barrier over and in contact with said polysilicon layer, said diffusion barrier including a refractory metal silicon nitride material composed of both tungsten silicon nitride and of titanium silicon nitride;

forming a refractory metal layer over and in contact with said diffusion barrier, such that said structure includes said gate oxide layer, said polysilicon layer, said diffusion barrier, and said refractory metal layer;

forming silicate glass on said structure; and heating both of said structure and said silicate glass, thereby causing fluid displacement of a portion of said silicate glass, said structure having a first sheet resistance before said heating and a second sheet resistance after said heating.

22. A process as recited in claim 21, wherein said first sheet resistance is less than 1.7 ohm/sq. and said second sheet resistance is less than 1.7 ohm/sq.

23. A process as recited in claim 22, wherein said second sheet resistivity is less than said first sheet resistance.

24. A process as recited in claim 21, wherein said silicate glass is borophosphosilicate glass.

25. A process as recited in claim 21, wherein said heating comprises an anneal process whereby both of said structure and said silicate glass are exposed to an annealing atmosphere having a temperature in a range from about 650° C. to about 1150° C. for a period in a range from about 10 seconds to about 90 seconds.

26. A process as recited in claim 21, wherein said heating comprises a rapid thermal anneal process.

* * * * *